(12) United States Patent
Zahorik

(10) Patent No.: US 6,287,919 B1
(45) Date of Patent: Sep. 11, 2001

(54) INTEGRATED CIRCUIT MEMORY CELL HAVING A SMALL ACTIVE AREA AND METHOD OF FORMING SAME

(75) Inventor: Russell C. Zahorik, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/372,893

(22) Filed: Aug. 12, 1999

Related U.S. Application Data

(62) Division of application No. 08/790,011, filed on Jan. 28, 1997, now Pat. No. 6,015,977.

(51) Int. Cl.$^7$ .................... H01L 21/00; H01L 21/8234
(52) U.S. Cl. ............................................. 438/275; 438/95
(58) Field of Search .................... 438/95, 5, 128, 438/275

(56) References Cited

U.S. PATENT DOCUMENTS

| | | | |
|---|---|---|---|
| 3,423,646 | 1/1969 | Cubert et al. | 317/234 |
| 3,796,926 | 3/1974 | Cole et al. | 317/234 R |
| 4,099,260 | 7/1978 | Lynes et al. | 365/105 |
| 4,115,872 | 9/1978 | Bluhm | 365/163 |

(List continued on next page.)

FOREIGN PATENT DOCUMENTS

| | | | |
|---|---|---|---|
| 0 117 045 | 8/1984 | (EP) | H01L/45/00 |
| 1 319 388 | 6/1973 | (GB) | H01L/9/00 |
| 60109266 | 6/1985 | (JP) | H01L/27/10 |

OTHER PUBLICATIONS

Kim and Kim, "Effects of High–Current Pulses on Polycrystalline Silicon Diode with n–type Region Heavily Doped with Both Boron and Phosphorus," *J. Appl. Phys.*, 53(7):5359–5360, 1982.

(List continued on next page.)

*Primary Examiner*—Long Pham
*Assistant Examiner*—William David Coleman
(74) *Attorney, Agent, or Firm*—Fletcher, Yoder & Van Someren

(57) ABSTRACT

A method for manufacturing a memory device having a plurality of memory cells. Each memory cell has a nonvolatile resistive memory element with a small active area. A plurality of memory cells are formed at selected locations of at least a portion of a semiconductor wafer. To form the memory cells, a lower electrode layer and a memory material layer are deposited over at least a portion of the wafer. Patterns are formed over desired contact locations of the memory material layer and etching is used to remove portions of the memory material layer. The etching step undercuts the patterns and forms memory elements having a protruding contact portion with an apex contact area. The pattern is removed, and an upper electrode is formed and electrically coupled to the contact area. Corresponding access devices and word/bit line conductor grids are provided and coupled to the memory cells.

15 Claims, 3 Drawing Sheets

U.S. PATENT DOCUMENTS

| | | | |
|---|---|---|---|
| 4,174,521 | 11/1979 | Neale | 357/45 |
| 4,180,866 * | 12/1979 | Shanks | 365/186 |
| 4,194,283 | 3/1980 | Hoffmann | 29/571 |
| 4,203,123 | 5/1980 | Shanks | 257/5 |
| 4,227,297 | 10/1980 | Angerstein | 29/571 |
| 4,272,562 | 6/1981 | Wood | 427/87 |
| 4,458,260 | 7/1984 | McIntyre et al. | 257/465 |
| 4,499,557 | 2/1985 | Holmberg et al. | 365/163 |
| 4,502,208 | 3/1985 | McPherson | 29/584 |
| 4,569,698 | 2/1986 | Feist | 148/1.5 |
| 4,630,355 | 12/1986 | Johnson | 29/575 |
| 4,642,140 | 2/1987 | Noufi et al. | 148/6.24 |
| 4,666,252 | 5/1987 | Yaniv et al. | 350/333 |
| 4,677,742 | 7/1987 | Johnson | 29/591 |
| 4,757,359 | 7/1988 | Chiao et al. | 257/316 |
| 4,795,657 | 1/1989 | Formigoni et al. | 427/96 |
| 4,804,490 | 2/1989 | Pryor et al. | 252/62.3 BT |
| 4,809,044 | 2/1989 | Pryor et al. | 257/3 |
| 4,823,181 | 4/1989 | Mohsen et al. | 257/530 |
| 4,876,220 | 10/1989 | Mohsen et al. | 438/326 |
| 4,876,668 | 10/1989 | Thakoor et al. | 365/163 |
| 4,881,114 | 11/1989 | Mohsen et al. | 357/54 |
| 4,892,840 | 1/1990 | Esquivel et al. | 438/296 |
| 5,144,404 | 9/1992 | Iranmanesh et al. | 357/51 |
| 5,166,096 | 11/1992 | Cote et al. | 438/586 |
| 5,166,758 | 11/1992 | Ovshinsky et al. | 257/3 |
| 5,177,567 | 1/1993 | Klersy et al. | 257/4 |
| 5,293,335 | 3/1994 | Pernisz et al. | 365/148 |
| 5,296,716 | 3/1994 | Ovshinsky et al. | 257/3 |
| 5,335,219 | 8/1994 | Ovshinsky et al. | 369/288 |
| 5,341,328 | 8/1994 | Ovshinsky et al. | 365/163 |
| 5,359,205 | 10/1994 | Ovshinsky | 257/3 |
| 5,363,329 | 11/1994 | Troyan | 365/184 |
| 5,414,271 | 5/1995 | Ovshinsky et al. | 257/3 |
| 5,510,629 | 4/1996 | Karpovich et al. | 257/50 |
| 5,534,711 | 7/1996 | Ovshinsky et al. | 257/3 |
| 5,534,712 | 7/1996 | Ovshinsky et al. | 217/3 |
| 5,536,947 | 7/1996 | Klersy et al. | 257/3 |
| 5,687,112 | 11/1997 | Ovshinsky | 365/163 |
| 5,714,768 | 2/1998 | Ovshinsky et al. | 257/40 |
| 5,714,795 | 2/1998 | Ohmi et al. | 257/530 |
| 5,751,012 | 5/1998 | Wolstenholme et al. | 257/5 |
| 5,789,277 * | 8/1998 | Zahorik et al. | 438/95 |
| 5,789,758 | 8/1998 | Reinberg | 257/3 |
| 5,814,527 * | 9/1998 | Wolstenholme et al. | 438/5 |
| 5,874,756 * | 2/1999 | Ema et al. | 256/296 |
| 5,893,732 * | 4/1999 | Morgan | 438/238 |
| 5,970,336 * | 10/1999 | Wolstenholme et al. | 438/238 |
| 5,998,244 * | 12/1999 | Wolstenholme et al. | 438/128 |

OTHER PUBLICATIONS

Neale and Aseltine, "The Application of Amorphous Materials to Computer Memories," *IEEE*, 20(2):195–205, 1973.

Pein and Plummer, "Performance of the 3–D Sidewall Flash EPROM Cell," *IEEE*, 11–14, 1993.

Post and Ashburn, "Investigation of Boron Diffusion in Polysilicon and its Application to the Design of p–n–p Polysilicon Emitter Bipolar Transistors with Shallow Emitter Junctions," *IEEE*, 38(11):2442–2451, 1991.

Post et al., "Polysilicon Emitters for Bipolar Transistors: A Review and Re–Evaluation of Theory and Experiment," *IEEE*, 39(7):1717–1731, 1992.

Post and Ashburn, "The Use of an Interface Anneal to Control the Base Current and Emitter Resistance of p–n–p Polysilicon Emitter Bipolar Transistors," *IEEE*, 13(8):408–410, 1992.

Rose et al., "Amorphous Silicon Analogue Memory Devices," *J. Non–Crystalline Solids,* 115:168–170, 1989.

Schaber et al., "Laser Annealing Study of the Grain Size Effect in Polycrystalline Silicon Schottky Diodes," *J. Appl. Phys.,* 53(12):8827–8834, 1982.

Yamamoto et al., "The I–V Characteristics of Polycrystalline Silicon Diodes and the Energy Distribution of Traps in Grain Boundaries," *Electronics and Communications in Japan,* Part 2, 75(7):51–58, 1992.

Yeh et al., "Investigation of Thermal Coefficient for Polycrystalline Silicon Thermal Sensor Diode," *Jpn. J. Appl. Phys.,* 31(Part 1, No. 2A):151–155, 1992.

Oakley et al., "Pillars—The Way to Two Micron Pitch Multilevel Metallisation," IEEE, 23–29, 1984.

* cited by examiner ized states. In the amorphous state, chalcogenide
INTEGRATED CIRCUIT MEMORY CELL HAVING A SMALL ACTIVE AREA AND METHOD OF FORMING SAME This application is a Divisional of Ser. No. 08/790,011 filed Jan. 28, 1997 now U.S. Pat. No. 6,015,977.

BACKGROUND OF THE INVENTION

1. Field of the Invention

The present invention relates generally to memories and, more particularly, to memory cells having chalcogenide memory elements.

2. Background of the Related Art

In the field of integrated circuit memory devices, there is a continuing trend toward memories that have store more information, consume less power, operate faster, take up less space, and cost less to make. While these are often competing interests, memory manufactures strive to make advances in these areas to remain competitive. Thus, the ability to manufacture small memory cells efficiently is crucial in maximizing the performance and cost-efficiency of a memory device.

Popular memories today include dynamic random access memories (DRAMs), static random access memories (SRAMs), read only memories (ROMs), and flash memories. Certain basic characteristics are shared by these memories. For example, these memories typically include one or more memory arrays, where each array has a plurality of memory cells arranged in rows and columns. Other than these basic characteristics, however, these memories possess many different attributes. By way of a general comparison, ROMs and flash memories do not exhibit true random access as do DRAMs and SRAMs. Also, DRAMs are volatile memories, i.e., they require constant power to retain the contents of the memory, while SRAMs, ROMs, and flash memories are non-volatile memories. Furthermore, DRAMs typically require less area on a die than the other memories, but DRAMs generally do not exhibit the fastest access times. Thus, as can be appreciated due to the many trade-offs between these different memory configurations, the type of memory used greatly depends upon the requirements of the system in which it is used.

One reason for these differences may be understood by referring to the memory cells used by these various memories. Although the memory cells of these different memories store data in the form of an electrical charge, the memory cells take different forms. The form of a memory cell may dictate many of a memory's characteristics. For instance, the memory cell of a typical dynamic random access memory (DRAM) generally includes a memory element and an access device. The memory element is typically a small capacitor, which stores data as the presence or absence of a charge on the capacitor. The access device, typically referred to as an access transistor, coupled to the small capacitor to control the charging and discharging of the capacitor.

DRAMs possess many desirable features, such as large storage capacity, high storage density, and ease of manufacture. However, due to the type of memory cell used, DRAMs also require periodic refreshing, i.e., the capacitors need to be periodically recharged, to maintain the stored information. Although the memory cells of SRAMs, ROMs, and flash memories do not require refreshing, they suffer from disadvantages, such as lower storage densities, larger size, and greater cost to manufacture.

Instead of using memory cells that store information in the form of an electrical charge, memory cells may be manufactured of a material that is capable of storing information. Chalcogenides are a class of materials that may be used to store information in an integrated circuit memory. Chalcogenide material may be electrically stimulated to change states, from an amorphous state to increasingly crystalline states. In the amorphous state, chalcogenide material exhibits a high electrical resistivity. As chalcogenide material progresses into an increasingly crystalline state, its electrical resistivity generally decreases. Because chalcogenide material retains its programmed state even after removal of the electrical stimulus, chalcogenide-based memories are non-volatile. As an added benefit, chalcogenide elements may be programmed into two or more states. Thus, chalcogenide-based memories may operate as traditional binary memories or as higher-based memories.

In chalcogenide-based memories, the memory cells are typically formed by disposing chalcogenide material between two electrodes. The size of the contact area between the electrode and the chalcogenide material appears to be related to the speed, power requirements, and capacity of a chalcogenide-based memory. It has been observed that the chalcogenide memory element has an active area which may be less than the area of the entire chalcogenide memory element. The size of this active area can be controlled by controlling the size of the contact area between the electrode and the chalcogenide element. The size of the active area appears to be related to the programming current and/or time required to achieve the desired state change. Thus, to increase programming rates and optimize programming current, it is desirable to minimize the dimension of the electrode contacting the chalcogenide element.

Techniques for reducing the contact area have focused on forming smaller sized electrodes. One conventional method for forming the electrode includes forming a receiving cavity in a dielectric layer and then depositing a conductive material in the cavity. Photolithography or etching has been used to establish the initial cavity through the insulator layer. However, these methods suffer from technological constraints upon the hole size. Other conventional techniques for forming the cavity in the insulator layer have included the application of a high current pulse to open a hole having a diameter on the order of 0.1–0.2 microns. The size of the cavity, and therefore the size of the electrodes, achieved through this method is generally unpredictable. Hence, the need remains for a method for repeatably and accurately establishing a small contact area between an electrode and a chalcogenide memory. element.

The present invention is directed to overcoming, or at least reducing the effects of, one or more of the problems set forth above.

SUMMARY OF THE INVENTION

In accordance with one aspect of the present invention, there is provided a method of forming a memory cell. A first electrode is formed. A memory element is electrically coupled to the first electrode. The memory element is formed using a photolithographic technique having a resolution limit. The memory element has a contact portion that has an area smaller than the resolution limit. A second electrode is formed and electrically coupled to the contact portion of the memory element.

In accordance with another aspect of the present invention, a method of forming a memory cell is provided. A first electrode is formed. A memory element is formed and electrically coupled to the first electrode. The memory element has a contact portion with an area of less than 0.04 microns². A second electrode is formed and electrically coupled to the contact portion of the memory element.

In accordance with a further aspect of the present invention, there is provided a method for manufacturing a memory cell for a memory device. A first electrode is formed. A memory element is formed and electrically coupled to the first electrode. A pattern is formed over a portion of the memory element. At least a portion of the memory element is removed to form a protruding portion of the memory element generally underneath the pattern. A second electrode is formed and electrically coupled to the protruding portion.

In accordance with yet another aspect of the present invention, there is provided a method for manufacturing a memory cell. A first electrode layer of conductive material is formed. A chalcogenide layer is formed and electrically coupled to at least a portion of the first electrode layer. A pattern is formed over a desired contact location on the chalcogenide layer. At least a portion of chalcogenide layer is etched away to form a protruding portion of chalcogenide generally underneath the pattern. A dielectric layer is formed on the chalcogenide layer. A portion of the dielectric layer is removed to expose at least a portion of the protruding portion. A second electrode layer is formed and electrically coupled to the exposed portion of the protruding portion. An access device is formed and electrically coupled to one of the first electrode layer and the second electrode layer.

In accordance with still another aspect of the present invention, there is provided a method for forming an array of memory cells on a semiconductor substrate. A plurality of bit lines is formed on the substrate. A plurality of access devices is formed, where each of the plurality of access devices is electrically coupled to a respective bit line. A lower electrode layer of conductive material is formed and electrically coupled to the access devices. A chalcogenide layer is formed and electrically coupled to the lower electrode layer. A pattern is formed over selected locations of the chalcogenide layer. At least a portion of the chalcogenide layer is etched away to form a protruding portion of chalcogenide generally underneath each pattern. A plurality of upper electrodes of an electrically conductive material is formed, where each of the plurality of upper electrodes is electrically coupled to a respective protruding portion. A plurality of word lines is formed, where each of the plurality of word lines is electrically coupled to respective upper electrodes.

In accordance with a yet flirter aspect of the present invention, there is provided a memory cell. The memory cell has a first electrode. The memory cell also has a memory element electrically coupled to the first electrode. The memory element has a protruding contact portion. A second electrode is electrically coupled to the protruding contact portion of the memory element.

In accordance with a still further aspect of the present invention, there is provided a memory cell having a first electrode. A memory element is electrically coupled to the first electrode. The memory element has a contact portion having an area of less than 0.04 microns². A second electrode is electrically coupled to the contact portion of the memory element.

In accordance with yet another aspect of the present invention, there is provided a memory cell having a first electrode. A memory element is disposed in electrical contact with the first electrode using a photolithographic technique which has a resolution in it. The memory element has a contact portion with an area smaller than the resolution in it. The second electrode is electrically coupled to the contact portion of the memory element.

In accordance with still another aspect of the present invention, there is provided a memory cell having a first electrode. A memory element is electrically coupled to the first electrode. The memory element is formed by forming a pattern over a portion of the memory element and by removing at least a portion of the memory element to form a protruding portion of the memory element generally underneath the pattern. A second electrode is electrically coupled to the protruding portion.

BRIEF DESCRIPTION OF THE DRAWINGS

Certain advantages of the invention will become apparent upon reading the following detailed description and upon reference to the drawings in which.

DESCRIPTION OF SPECIFIC EMBODIMENTS

Figure 1:
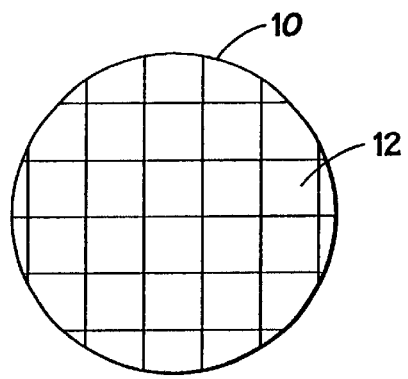
FIG. 1 is a top plan view of a wafer having a plurality of die thereon.

Turning now to the drawings, and referring initially to FIG. 1, a wafer, such as a semiconductor wafer, is illustrated and generally designated by a reference numeral 10. One or more integrated circuits may be fabricated on the wafer 10. The wafer 10 may be separated into a plurality of integrated circuit dies 12, which may be packaged as integrated circuit chips.

Figure 2:
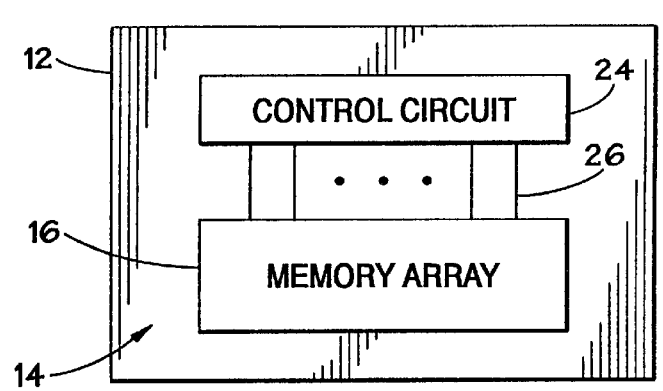
FIG. 2 is a diagramatic illustration of a memory device on a portion of a die.
Figure 3:
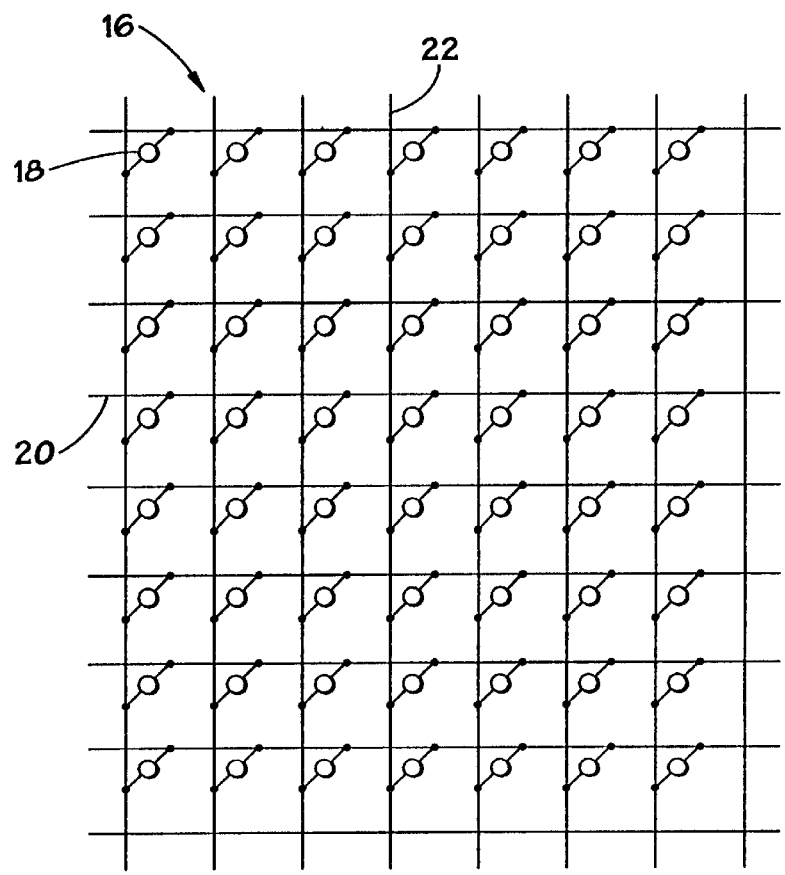
FIG. 3 is a schematic illustration of a memory array.

A die 12 may contain an integrated circuit memory 14, such as that illustrated in FIG. 2. The memory 14 may include one or more memory arrays 16. The memory array 16 typically includes a plurality of memory cells 18 that are arranged in generally perpendicular rows and columns, as illustrated in FIG. 3. The memory cells 18 in each row typically share an electrical connection referred to as a word line 20, and the memory cells 18 in each column typically share an electrical connection referred to as a bit line 22. The memory array 16 is coupled to control circuitry 24 by lines 26. The control circuitry 24 accesses each memory cell 18 for reading or writing by selecting the appropriate row and column coordinates to activate a corresponding access or isolation device.

Figure 4:
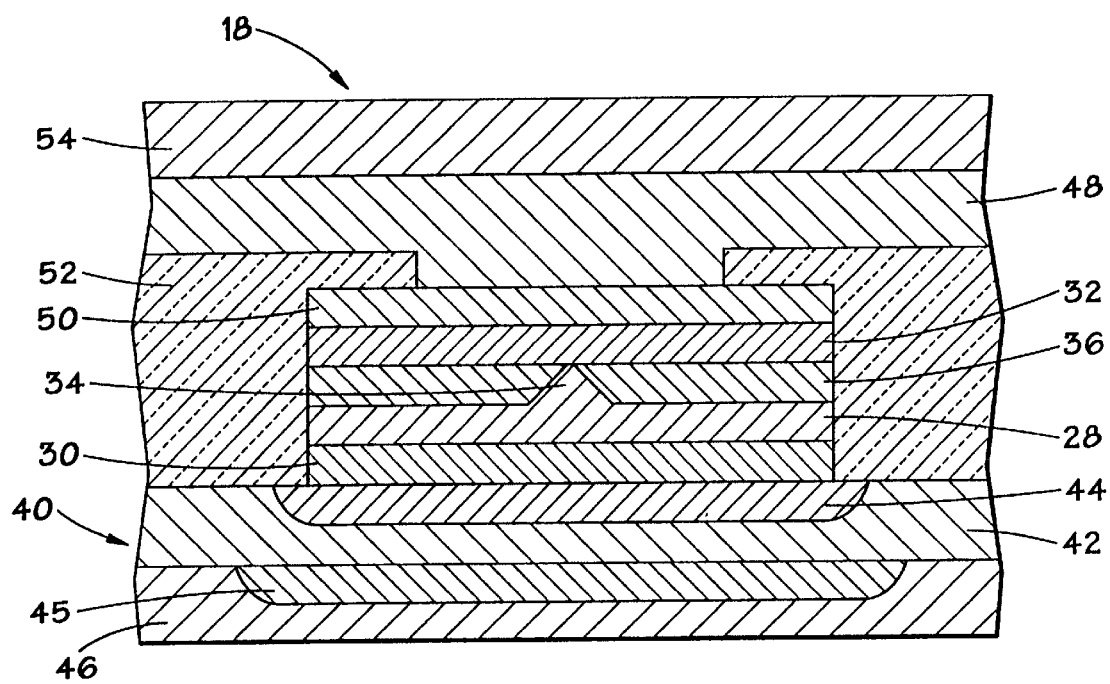
FIG. 4 is a cross-sectional view of a memory cell in accordance with the present invention.

FIG. 4 illustrates an exemplary memory cell 18 of the memory array 16. The structure of the memory cell 18 will be described first with reference to FIG. 4, and a method of manufacturing the memory cell 18 will be described later with reference to FIGS. 5–8. Although the memory cell 18 includes a memory element and an access device, the memory element will be the primary focus of the following discussion.

The memory element includes a chalcogenide element 28 that is disposed between a lower electrode 30 and an upper electrode 32. The electrodes 30 and 32 are typically formed of a conductive material, such as molybdenum, tungsten, or titanium. In one specific example, each electrode 30 and 32 may include a metal layer and a layer of carbon (not shown), with the layer of carbon being disposed on each side of the chalcogenide element 28. The layer of carbon on each side of the chalcogenide element 28 blocks diffusion between the chalcogenide element 28 and the metal layers of the electrodes 30 and 32.

The chalcogenide element 28 is a generally uniform layer having a protruding contact portion 34. In one embodiment, the contact portion 34 is pyramidally shaped or conically shaped. The chalcogenide element may measure less that 0.1 micron in diameter. Alternative shapes for the contact portion 34 may include other geometric volumes having a raised apex. The tip of the contact portion 34 defines a reduced contact area between the chalcogenide element 28 and the upper electrode 32. It is believed that this reduced contact area facilitates a more localized active area of the chalcogenide element 28. This more localized active area is believed to possess more uniform structural characteristics, thus enabling the chalcogenide element 28 to operate in a more controllable and repeatable fashion. In other words, the chalcogenide element 28 shifts between its amorphous state and its various levels of crystallinity in a more predictable and controllable manner.

The chalcogenide element 28 may be composed of a combination of tellurium, germanium, and antimony, such as a $Te_{56} Ge_{22} Sb_{22}$ chalcogenide alloy. Other suitable alloys may include certain alloys formed from tellurium, selenium, germanium, antimony, bismuth, lead, strontium, arsenic, sulfur, silicon, phosphorus, and/or oxygen. Other possibly suitable materials may include materials capable of assuming multiple generally stable states in response to a stimulus.

A layer of insulating material 36 is disposed between areas of the chalcogenide element 28 and the upper electrode 32 surrounding the contact portion 34. The insulator layer 36 is typically a dielectric material, such as silicon nitride or silicon dioxide. The insulator layer 36 prevents current from flowing through the memory element 27 other than through the contact portion 34.

The access device is coupled to the memory element. As illustrated in FIG. 4, the access device is a diode generally designated by the reference numeral 40. The diode 40, in the illustrated embodiment, includes an n doped region 42 and a p+ doped region 44. This p-n junction diode 40 serves to isolate the memory cell 18 from other memory cells of the array 16, as it permits current to flow through the memory cell 18 in only one direction. While a p-n junction diode 40 is disclosed herein as an access device, it should be understood that other devices may be used, such a transistor or a diode formed using a Schottky barrier.

To couple the memory cell 18 to other portions of the memory, a bit line and a word line are provided. The bit line is formed by an n+ doped line 45 that is electrically coupled to the n doped region 42 of the diode 40. The n+ doped line 45 extends in a line perpendicular to the drawing sheet of FIG. 4. The n+ doped line 45 is formed in a p substrate 46 by a conventional method, such as diffusion or ion implantation. The n+ doped line 45 is typically coupled to other memory cells in the same column as the memory cell 18.

The word line is formed by a conductive line 48 that is electrically coupled to the upper electrode 32. As illustrated, a barrier layer 50 may be disposed over the upper electrode 32 as a diffusion barrier to prevent contamination. The barrier layer 46 is a conductive material, such as titanium nitride. The conductive line 48 extends in a line parallel to the drawing sheet of FIG. 4 and is typically coupled to other memory cells in the same row as the memory cell 18.

Adjacent memory cells 18 are typically electrically isolated from one another by a dielectric barrier, such as the barrier 52, which may be made of silicon dioxide, for example. The entire structure may be encapsulated in an insulating layer 54, which may be made of silicon nitride or BSPG, for example.

FIGS. 5–8 illustrate exemplary steps of a method for manufacturing the memory cell 18 of FIG. 4. The manufacture of only one memory cell 18 is illustrated and discussed herein, but it should be understood that more than one memory cell 18 can be manufactured at a time, as is known in the art. It should also be noted that FIGS. 5–8 do not illustrate a memory cell 18 during every step of manufacture, as such detail is not warranted to obtain a full understanding of the disclosed method of manufacture. Rather, FIGS. 5–8 illustrate the state of manufacture of a memory cell 18 at certain times.

Figure 5:
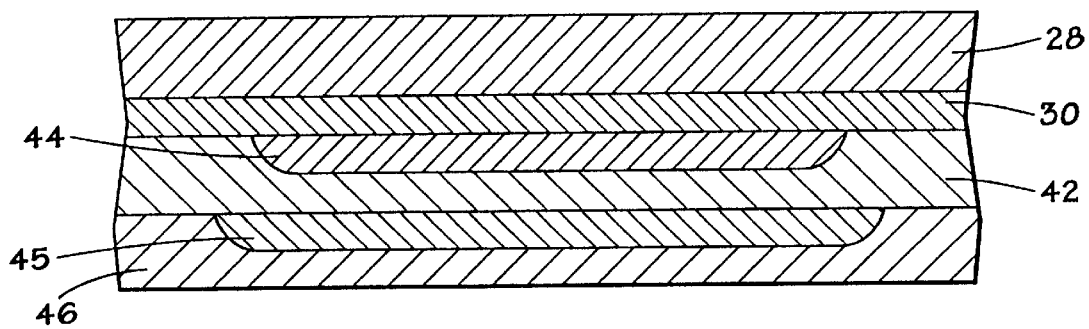
FIG. 5 is a cross-sectional view of a first intermediate stage of manufacture of the memory cell illustrated in FIG. 4.

Referring first to FIG. 5, to form the n+ doped bit lines 45, photoresist is deposited onto the p type substrate 46. Using a mask, portions of the photoresist are cured, and the uncured photoresist is etched to form windows exposing the underlying p type substrate 46. The exposed portions of the p type substrate 46 are doped by diffusion or ion implantation, for instance, to form the n+ doped bit lines 45.

To form the diodes 40, the remaining photoresist is removed and a layer of n doped substrate 42 is formed. Typically, the n doped substrate 42 is formed by depositing, or by epitaxially growing, silicon over the p type substrate 46 and over the n+ doped bit lines 45. Another layer of photoresist is applied, and portions of it are cured using an appropriate mask. The uncured portions of this photoresist layer are etched away to form windows exposing the underlying n doped substrate 42. The exposed portions of the n doped substrate 42 are doped by diffusion or ion implantation, for instance, to form the p+ doped regions 44.

Once the bit lines and the diodes have been formed, the remaining photoresist is removed. The lower electrode 30 is formed by depositing the appropriate layer or layers of conductive material onto the n doped substrate 42 and the p+ doped regions 44. For example, the lower electrode 30 may include two layers. The first layer may be a metal layer that is deposited using a sputtering process. The second layer may be a carbon layer deposited using chemical vapor deposition. The layer of chalcogenide material 28 is then deposited on the lower electrode 30.

Figure 6:
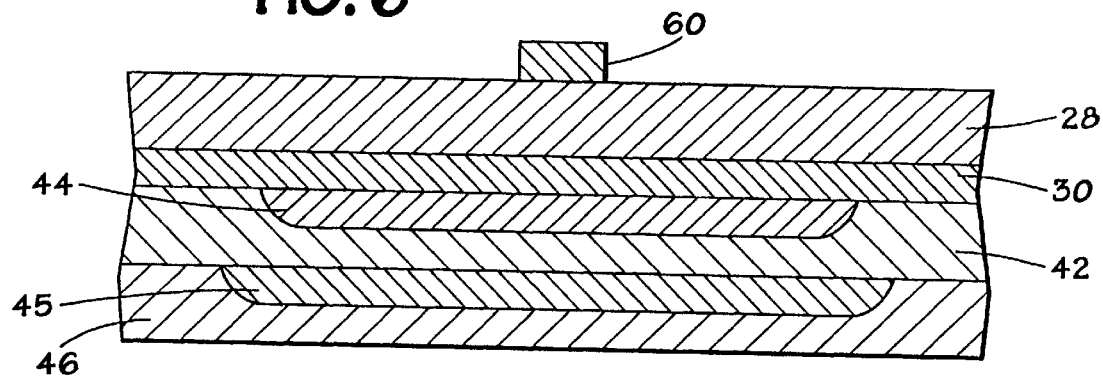
FIG. 6 is a cross-sectional view of a second intermediate stage of manufacture of the memory cell illustrated in FIG. 4.
Figure 7:
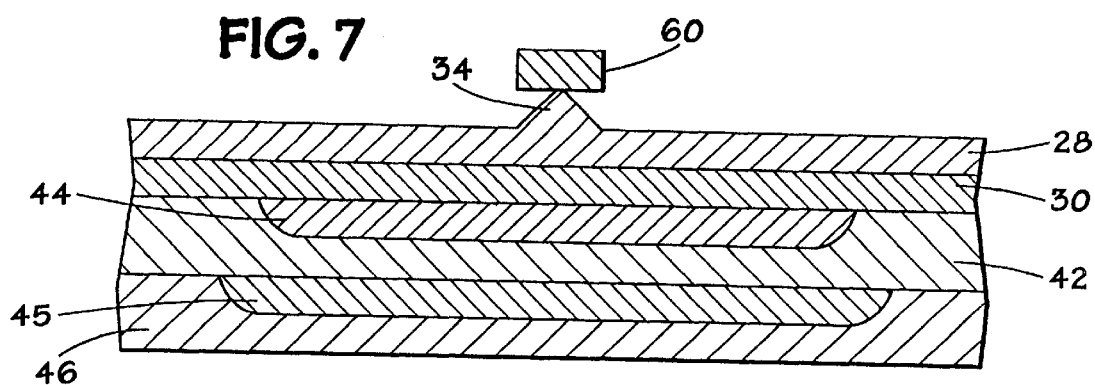
FIG. 7 is a cross-sectional view of a third intermediate stage of manufacture of the memory cell illustrated in FIG. 4.

To form the contact portion 34, a layer of photoresist is deposited on the chalcogenide layer 28. Portions of the photoresist layer are cured using an appropriate mask, and the uncured portions are removed. FIG. 6 illustrates a pattern 60 formed by a cured portion of the photoresist layer. Some or all of the chalcogenide layer 28 is etched away. Because the portion of the chalcogenide layer 28 underneath the pattern 28 is partially protected from the etchant, the contact portion 34 remains at the end of the etching process, as illustrated in FIG. 7.

The pattern 60 typically has dimensions that are close to the photolithographic limit. Currently, this limit is about 0.2 microns. Thus, the dimensions of the cured portion may be in the range of 0.2 microns to 1.0 micron, for example. However, it is understood that the dimensions of the pattern 60 may shrink as the methods for forming a smaller pattern 60 become available.

The pattern 60 may have a round or square shape, for example. If the pattern 60 has a round shape, the contact portion 34 may have a conical shape. If the pattern 60 has a square shape, the contact portion 34 may have a pyramidal shape. An isotropic etchant is typically used because such etchants undercut the pattern 60 to shape the chalcogenide material 28 underneath the pattern 60 into a contact portion 34 having a contact area smaller than the dimensions of the pattern 60. Thus, the contact portion 34 typically has dimensions in the range of 0.05 to 0.2 microns, and ususally less than 0.1 microns.

Figure 8:
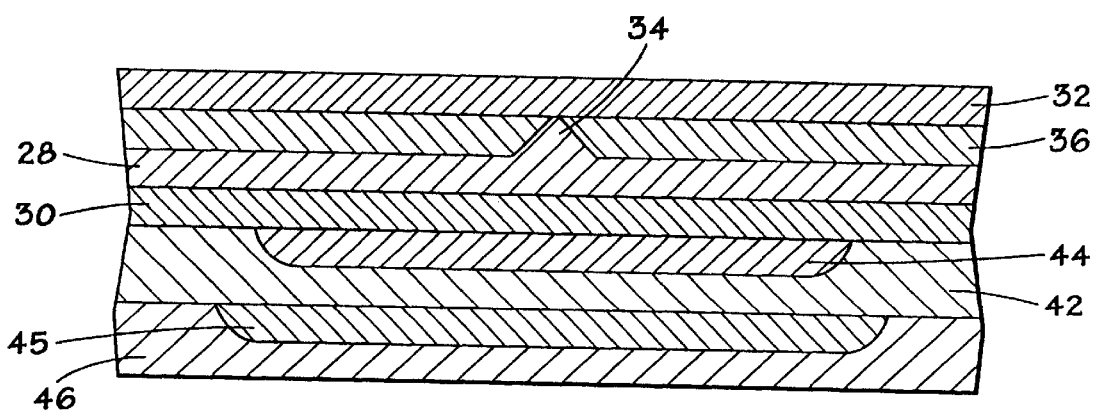
FIG. 8 is a cross-sectional view of a fourth intermediate stage of manufacture of the memory cell illustrated in FIG. 4.

The pattern 60 may be removed by a suitable process, such as etching or chemical mechanical planarization (CMP). Then, a layer of insulating material 36 is deposited over the chalcogenide layer 28, as illustrated in FIG. 8. Because the insulator layer 36 covers the entire chalcogenide layer 28, a portion of the insulator layer 36 is removed to expose the apex, i.e., the upper tip, of the contact portion 34. A suitable process, such as a controlled etch or CMP, may be used. Given the small size of the contact portion 34, the exposed tip of the contact portion 34 may have an area of less than 0.0025 microns to about 0.04 microns.

The upper electrode 32 is deposited over the insulator layer 36 and, thus, placed in electrical contact with the tip of the contact portion 34. The area of the contact portion 34 contacting the upper electrode 32, in this case the general area surrounding the tip of the contact portion 34, becomes the active area of the chalcogenide element 28. The remaining layers illustrated in FIG. 4 may then be deposited and appropriately etched to fabricate an individual memory cell 18, as is known in the art.

Although the invention may be susceptible to various modifications and alternative forms, specific embodiments have been shown by way of example in the drawings and have been described in detail herein. However, it should be understood that the invention is not intended to be limited to the particular formed disclosed. Rather, the invention is to cover all modifications, equivalents, and alternatives falling withing the spirit and scope of the invention as defined by the following appended claims.

What is claimed is:

1. A method of forming a memory cell, said method comprising the steps of:
   (a) forming a first electrode;
   (b) forming a memory element electrically coupled to said first electrode using a photolithographic technique having a resolution limit;
   (c) forming a pattern on said memory element;
   (d) etching away a portion of said memory element underneath said pattern to form a contact portion, said contact portion having an area smaller than said resolution limit; and
   (e) forming a second electrode electrically coupled to said contact portion of said memory element.

2. The method, as set forth in claim 1, wherein step (c) comprises the step of forming said pattern having at least one dimension at about said resolution limit.

3. A method of forming a memory cell, said method comprising the steps of:
   (a) forming a first electrode;
   (b) forming a memory element electrically coupled to said first electrode using a photolithograhic technique having a resolution limit, said memory element having a contact portion having an area smaller than said resolution limit;
   (c) forming a dielectric on said memory element;
   (d) removing a portion of said dielectric to expose at least a portion of said contact portion; and
   (e) forming a second electrode electrically coupled to said contact portion of said memory element.

4. The method, as set forth in claim 3, wherein step (d) comprises the step of removing said portion of said dielectric using chemical mechanical planarization.

5. The method, as set forth in claim 1, further comprising the step of forming an access device being electrically coupled to one of said first electrode and said second electrode.

6. A method for manufacturing a memory cell for a memory device, the method comprising the steps of:
   (a) forming a first electrode;
   (b) forming a memory element, said memory element being electrically coupled to said first electrode;
   (c) forming a pattern over a portion of said memory element;
   (d) removing at least a portion of said memory element to form a protruding portion of said memory element generally underneath said pattern; and
   (e) forming a second electrode, said second electrode being electrically coupled to said protruding portion.

7. The method, as set forth in claim 6, wherein step (e) comprises the steps of:
   (i) forming a dielectric on said memory element; and
   (ii) removing a portion of said dielectric to expose at least a portion of said contact portion.

8. The method, as set forth in claim 7, wherein said exposed portion of said contact portion has an area of less than 0.04 $micron^2$.

9. The method, as set forth in claim 7, wherein step (ii) comprises the step of removing said portion of said dielectric using chemical mechanical planarization.

10. The method, as set forth in claim 6, further comprising the step of forming an access device being electrically coupled to one of said first electrode and said second electrode.

11. A method for manufacturing a memory cell, the method comprising the steps of:
   (a) forming a first electrode layer of conductive material;
   (b) forming a chalcogenide layer, said chalcogenide layer being electrically coupled to at least a portion of said first electrode layer;
   (c) forming a pattern over a desired contact location on said chalcogenide layer;
   (d) etching away at least a portion of said chalcogenide layer to form a protruding portion of chalcogenide generally underneath said pattern;
   (e) forming a dielectric layer on said chalcogenide layer;
   (f) removing a portion of said dielectric layer to expose at least a portion of said protruding portion;
   (g) forming a second electrode layer, said second electrode layer being electrically coupled to said exposed portion of said protruding portion; and
   (h) forming an access device, said access device being electrically coupled to one of said first electrode layer and said second electrode layer.

12. The method, as set forth in claim 11, wherein said exposed portion of said contact portion has an area of less than 0.04 $micron^2$.

13. The method, as set forth in claim 11, wherein said exposed portion of said contact portion has an area of less than 0.02 $micron^2$.

14. The method, as set forth in claim 11, wherein said exposed portion of said contact portion has an area of about 0.0025 micron$^2$.

15. A method for forming an array of memory cells on a semiconductor substrate, the method comprising the steps of:
(a) forming a plurality of bit lines on said substrate;
(b) forming a plurality of access devices, each of said plurality of access devices being electrically coupled to a respective bit line;
(c) forming a lower electrode layer of a conductive material, said lower electrode layer being electrically coupled to said access devices;
(d) forming a chalcogenide layer, said chalcogenide layer being electrically coupled to said lower electrode layer;
(e) forming a pattern over selected locations of said chalcogenide layer;
(d) etching away at least a portion of said chalcogenide layer to form a protruding portion of chalcogenide generally underneath each pattern; and
(e) forming a plurality of upper electrodes of an electrically conductive material, each of said plurality of upper electrodes being electrically coupled to a respective protruding portion;
(f) forming a plurality of word lines, each of said plurality of word lines being electrically coupled to respective upper electrodes.

* * * * *